United States Patent
Burnsed et al.

(10) Patent No.: US 10,325,751 B1
(45) Date of Patent: Jun. 18, 2019

(54) THIN-FILM PHOSPHOR DEPOSITION

(71) Applicant: L-3 Communications Corporation-Insight Technology Division, Tempe, AZ (US)

(72) Inventors: Jon Burnsed, Tempe, AZ (US); Stephen Styonavich, Tempe, AZ (US)

(73) Assignee: L-3 Communications Corporation-Insight Technology Division, Tempe, AZ (US)

( * ) Notice: Subject to any disclaimer, the term of this patent is extended or adjusted under 35 U.S.C. 154(b) by 8 days.

(21) Appl. No.: 15/826,477

(22) Filed: Nov. 29, 2017

(51) Int. Cl.
*H01L 33/44* (2010.01)
*H01J 31/50* (2006.01)
*H01J 29/28* (2006.01)
*H01J 9/22* (2006.01)
*C09K 11/77* (2006.01)
*C23C 16/30* (2006.01)
*C23C 16/40* (2006.01)
*C23C 16/455* (2006.01)
*G02B 6/04* (2006.01)

(52) U.S. Cl.
CPC ........ *H01J 31/506* (2013.01); *C09K 11/7771* (2013.01); *C09K 11/7789* (2013.01); *C23C 16/305* (2013.01); *C23C 16/403* (2013.01); *C23C 16/404* (2013.01); *C23C 16/405* (2013.01); *C23C 16/45555* (2013.01); *H01J 9/22* (2013.01); *H01J 29/28* (2013.01); *G02B 6/04* (2013.01); *H01J 2229/183* (2013.01); *H01J 2229/8903* (2013.01)

(58) Field of Classification Search
None
See application file for complete search history.

(56) References Cited

U.S. PATENT DOCUMENTS

| | | | | |
|---|---|---|---|---|
| 2,970,219 A | * | 1/1961 | Roberts | H01J 29/38 250/214 VT |
| 3,436,550 A | * | 4/1969 | Finkle | H01J 31/49 250/214 VT |
| 3,482,104 A | * | 12/1969 | Finkle | H01J 29/38 250/214 VT |
| 3,500,101 A | * | 3/1970 | Burns | H01L 31/14 250/214 LA |
| 3,543,032 A | * | 11/1970 | Kazan | H01L 31/14 250/214 LA |
| 3,628,080 A | * | 12/1971 | Lindeqvist | H01J 29/892 250/214 VT |
| 3,660,668 A | * | 5/1972 | Wolski | H01J 31/507 250/214 VT |

(Continued)

*Primary Examiner* — Crystal L Hammond
(74) *Attorney, Agent, or Firm* — Grossman, Tucker, Perreault & Pfleger, PLLC

(57) ABSTRACT

An enhanced vision system includes an image intensifier that includes a phosphor screen. The phosphor screen includes a thin-film phosphor layer deposited, patterned, transferred, or otherwise disposed on the substrate using a thin-film deposition technique. A conductive layer is deposited across at least a portion of the phosphor layer. The relatively smooth morphology of the phosphor layer beneficially permits the use of a relatively thin conductive layer. The use of a relatively thin conductive layer advantageously reduces the operating voltage between an electron multiplier and the phosphor screen. A secondary electron emitter may be disposed across at least a portion of the conductive layer.

37 Claims, 5 Drawing Sheets

(56) References Cited

U.S. PATENT DOCUMENTS

| | | | | |
|---|---|---|---|---|
| 3,668,396 A * | 6/1972 | Asars | | G01T 1/1645 250/214 VT |
| 3,760,216 A * | 9/1973 | Lasser | | H01J 31/507 313/103 CM |
| 3,838,273 A * | 9/1974 | Cusano | | G21K 4/00 250/214 VT |
| 3,855,035 A * | 12/1974 | Bates, Jr. | | B32B 27/08 156/276 |
| 3,906,277 A * | 9/1975 | Schade | | H01J 29/00 313/365 |
| 4,264,408 A * | 4/1981 | Benham | | C03C 25/00 216/25 |
| 4,778,565 A * | 10/1988 | Enck | | G21K 4/00 216/24 |
| 5,097,175 A * | 3/1992 | Thomas | | H01J 29/28 313/461 |
| 5,137,598 A * | 8/1992 | Thomas | | H01J 29/20 216/25 |
| 5,268,612 A * | 12/1993 | Aebi | | H01J 43/246 313/103 CM |
| 5,296,117 A * | 3/1994 | De Jaeger | | C09K 11/025 204/486 |
| 5,360,630 A * | 11/1994 | Thomas | | C09K 11/567 427/157 |
| 5,646,477 A * | 7/1997 | Yamagishi | | H01J 29/385 250/214 VT |
| 5,912,939 A * | 6/1999 | Hirsch | | H05G 2/001 378/190 |
| 7,074,631 B2 * | 7/2006 | Erchak | | H01L 33/20 257/E33.068 |
| 2005/0271341 A1 * | 12/2005 | Riches | | G02B 13/16 385/133 |
| 2011/0215348 A1 * | 9/2011 | Trottier | | F21V 9/08 257/89 |
| 2013/0161535 A1 * | 6/2013 | Nuetzel | | H01J 29/892 250/458.1 |
| 2018/0122993 A1 * | 5/2018 | Camras | | H01L 33/005 |

* cited by examiner

THIN-FILM PHOSPHOR DEPOSITION

TECHNICAL FIELD

The present disclosure relates to thin-film deposited phosphors.

BACKGROUND

An image intensifier amplifies the photons reflected or emitted by objects within the field-of-view of the image intensifier. Image intensifiers may amplify incident photons in one or more human-visible electromagnetic wavelengths (e.g., incident electromagnetic energy in the visible spectrum between 390 nanometers and 700 nanometers) and/or one or more human-invisible electromagnetic wavelengths (e.g., the infrared electromagnetic spectrum above 700 nanometers or the ultraviolet electromagnetic spectrum below 390 nanometers).

An image intensifier typically includes a photocathode to generate photo-electrons, an electron multiplier such as a microchannel plate to generate secondary electrons, and a phosphor screen to convert the secondary electrons to photons at a human-visible wavelength. Typically, a first voltage differential is maintained between the photocathode and the microchannel plate to create a first electric field in the vacuum between the photocathode and the microchannel plate. The first electric field assists the departure of the photo-electrons from the photocathode and i.e., accelerates the photo-electrons as they travel toward the microchannel plate. A second voltage differential is maintained across the microchannel plate (i.e., the inlet side of the microchannel plate is at a different voltage than the outlet side of the microchannel plate). A third voltage differential between the microchannel plate and the phosphor screen creates a third electric field in the vacuum between the microchannel plate and the phosphor screen. The third electric field assists in the departure of the secondary electrons from the microchannel plate and accelerates the secondary electrons toward the phosphor screen.

Image intensifiers operate by collecting or capturing existing light photons using a simple or compound objective lens array. The source of the existing light photons may be naturally occurring (e.g., starlight, moonlight) or artificially generated (e.g., street lights, defined wavelength illuminators). Existing light photons enter the image intensifier through the objective lens array and strike the photocathode. The photocathode converts the incident existing light photons to photo-electrons that are accelerated through the first electric field.

The microchannel plate contains a large number of small channels that penetrate completely through the microchannel plate. Several secondary electrons are generated when a photo-electron enters a channel and impacts an internal wall of the channel. The second voltage differential across the microchannel plate accelerates the secondary electrons generated by the impact of the photo-electron with the channel wall. The accelerated secondary electrons impact the channel wall, generating a cascade of additional secondary electrons. Thus, one incident photoelectron may cause the generation of hundreds or even thousands of additional secondary electrons which exit the microchannel plate.

The secondary electrons exiting the microchannel plate accelerate through the third electric field and impact the phosphor screen. The impact of a large number of secondary electrons on the phosphor screen causes the phosphor screen to glow, providing an intensified image visible to the human eye.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
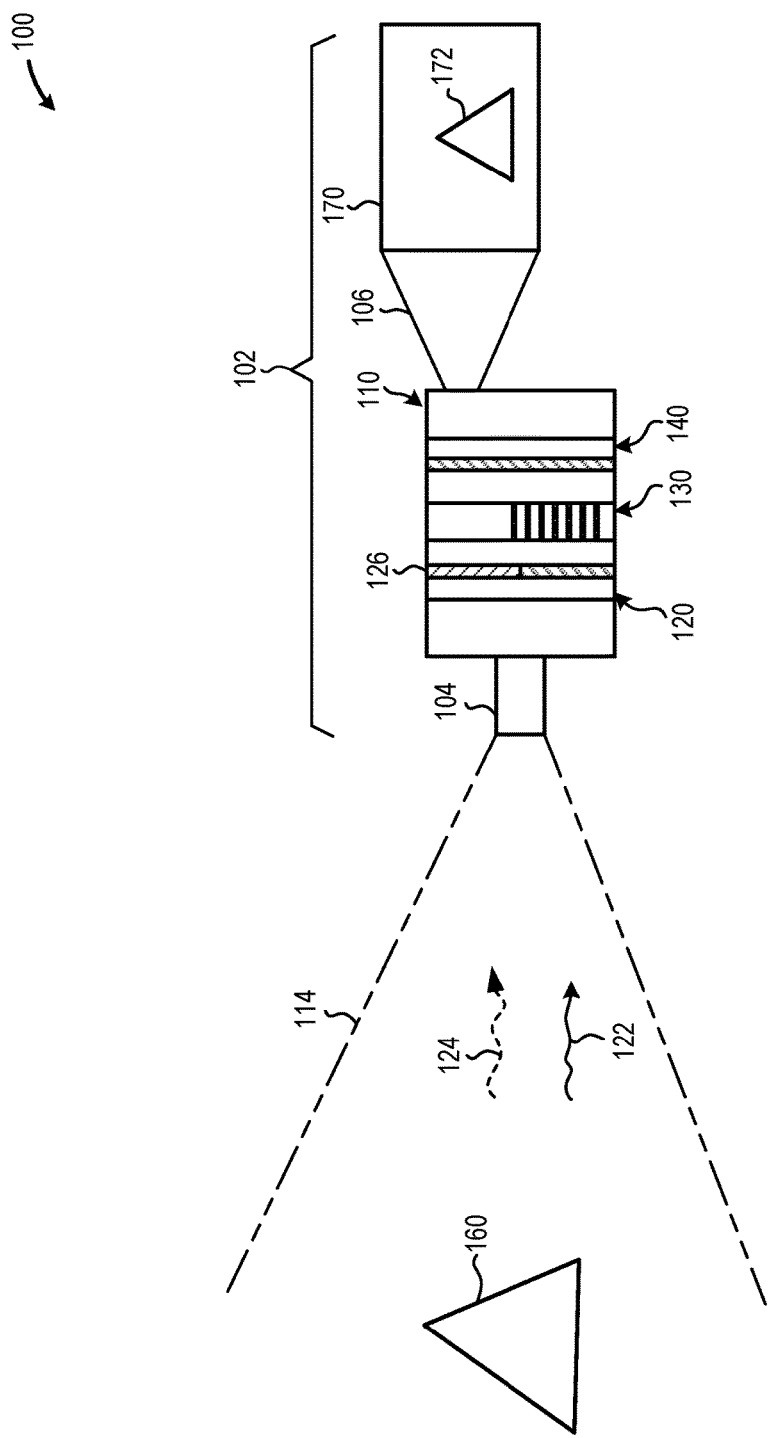
FIG. 1 depicts an illustrative enhanced vision system that includes an image intensifier having a phosphor screen that includes one or more thin-film deposited phosphor layers and a relatively thin conductive layer, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein provide enhanced vision systems and methods in which the phosphor layer is deposited as a thin-film to form the phosphor screen. Thin-film deposition ("TFD") includes, but is not limited to: chemical deposition and physical vapor deposition. Example chemical deposition processes include, but are not limited to, chemical vapor deposition ("CVD"); spin coating; electroplating; chemical solution deposition ("CSD"); plasma enhanced chemical vapor deposition ("PECVD"); and atomic layer deposition ("ALD"). Example physical vapor deposition techniques include, but are not limited to: thermal evaporation; electron beam evaporation; molecular beam epitaxy ("MBE"); sputtering; pulsed laser deposition; cathodic arc deposition; and electrohydrodyamic deposition.

Previously, phosphor compounds were painstakingly manually applied to a substrate. The manual phosphor application process resulted in a relatively thick phosphor layer and a relatively high level of wastage in the deposition process. The use of a thin layer deposition process provides greater uniformity in the phosphor layer, beneficially reducing the amount of wastage in the deposition process. Further, when compared to manually applied phosphors, the thin layer deposition process advantageously provides a phosphor layer having a more uniform thickness, a reduced surface roughness, and an improved surface morphology all of which assist in facilitating the deposition of charge collecting conductive layer across all or a portion of the phosphor. The improved surface morphology and reduced surface roughness of the thin-film phosphor layer effectively reduce the thickness of conductive layer material required to "fill" the irregularities in the surface of the phosphor layer. A thinner conductive layer reduces the voltage requirement within the third electric field between the microchannel plate and the phosphor screen. Reducing the voltage within the third electric field reduces the energy consumption of the enhanced vision device, an important consideration for battery powered enhanced vision devices. Additionally, reducing the voltage within the third electric field permits a tighter spacing between the microchannel plate and the phosphor screen, beneficially reducing the likelihood of electron scattering and improving resolution.

The use of a thin-film deposition technique to apply the phosphor layer may permit the use of a thin secondary electron emitter between the phosphor layer and the conductive layer without significantly impacting the third electric field voltage. At least a portion of the secondary electrons emitted by the microchannel plate may cause the secondary electron emitting material to emit two or more secondary electrons. The increased number of secondary electrons may impact the phosphor layer, causing the phosphor layer to generate photons in excess of those ordinarily generated by the impact of secondary electrons emitted by the microchannel plate. Thus, the use of a secondary electron emitting material may improve the performance of the enhanced vision device by increasing the contrast in the image presented to the system user. Improving the contrast may enable the system user to see details or objects within the field-of-view that may have been less visible without the enhanced brightness and contrast provided by the secondary electron emitting material. Example secondary electron emitting materials include, but are not limited to: aluminum oxide ($Al_2O_3$), magnesium oxide (MgO), beryllium oxide (BeO), yttrium oxide ($Y_2O_3$), and lead oxide (PbO).

The phosphor layer may include one or more phosphorescent materials. Such phosphorescent materials may include, but are not limited to: one or more yttrium-based phosphors (P22R, P45, P46, P47, P53, etc.); one or more zinc-based phosphors (P4, P7, P11, P12, P15, P17, P22G, P22B, P31, P38, P39, P40, etc.); and one or more gadolinium-based phosphors (P43, etc.). In one or more embodiments, the phosphor layer may include a yttrium-oxysulfide phosphor doped with either europium ($Y_2O_2S$:Eu) or terbium ($Y_2O_2S$:Tb). Other dopants or combinations of dopants may be used to adjust emission spectra, decay time, and/or crystallinity.

The phosphor layer may be deposited, patterned, formed, deposited, transferred, or otherwise applied to a substrate. In embodiments, the substrate may include one or more transparent materials that permit the passage of electromagnetic radiation within the visible portion of the electromagnetic spectrum (i.e., transparent to all or a portion of the electromagnetic spectrum having wavelengths from 390 nanometers to 700 nanometers), such as a transparent fiber optic bundle used to re-invert the enhanced image for presentation to the system user. In embodiments, the substrate may include one or more translucent or opaque materials that obstruct, attenuate, or otherwise do not permit the passage of electromagnetic radiation within the visible portion of the electromagnetic spectrum.

An image intensifier phosphor screen is provided. The phosphor screen may include: a substrate; a phosphor layer that includes at least one thin-film deposited phosphor layer having a peak-to-valley (PV) surface roughness of from: 0.050 nanometers (nm) to 1 nm disposed across at least a portion of the substrate; and a conductive layer having a thickness of less than 500 nanometers (nm) deposited across at least a portion of the phosphor layer.

A method of forming an image intensifier phosphor screen is also provided. The method may include: depositing, via thin-film deposition, a thin-film phosphor layer across at least a portion of a substrate, the-thin-film phosphor layer having a peak-to-valley (PV) surface roughness of from: 0.050 nanometers (nm) to 1 nm; and depositing a conductive layer having a thickness of less than 500 nanometers (nm) across at least a portion of the thin-film phosphor layer.

An image intensifier apparatus is provided. The image intensifier apparatus may include: a photocathode; a multichannel plate having a first surface and a second surface, the first surface of the microchannel plate spaced apart from the photocathode forming a first vacuum space therebetween; a phosphor screen spaced apart from the second surface of the multichannel plate forming a second vacuum space therebetween, the phosphor screen comprising: a phosphor layer that includes at least one thin-film deposited phosphor layer having a peak-to-valley (PV) surface roughness of from: 0.050 nanometers (nm) to 1 nm disposed across at least a portion of the substrate; and a conductive layer having a thickness of less than 500 nanometers (nm) deposited across at least a portion of the phosphor layer; and a twisted fiber optic bundle having a first end and a second end twisted 180 degrees with respect to the first end, the first end of the twisted fiber optic bundle disposed proximate the phosphorescent display.

As used herein, the terms "top," "bottom," "up," "down," "upward," "downward," "upwardly," "downwardly" and similar directional terms should be understood in their relative and not absolute sense. Thus, a component described as being "upwardly displaced" may be considered "laterally displaced" if the device carrying the component is rotated 90 degrees and may be considered "downwardly displaced" if the device carrying the component is inverted. Such implementations should be considered as included within the scope of the present disclosure.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used herein, the term "visible electromagnetic spectrum" refers to the portion of the human-visible electromagnetic spectrum having wavelengths falling between approximately 400 nanometers (nm) and approximately 750 nm. Such electromagnetic radiation may be colloquially referred to as "visible light."

As used herein, the terms "near infrared," "near IR," and "NIR" refer to the portion of the electromagnetic spectrum having wavelengths falling between approximately 750 nm and approximately 1400 nm (1.4 µm).

As used herein, the terms "short wave infrared," "short-wave IR," and "SWIR" refer to the portion of the electromagnetic spectrum having wavelengths falling between approximately 900 nm and approximately 3000 nm (3 µm).

As used herein, the term "ultraviolet electromagnetic spectrum," and "UV electromagnetic spectrum" refer to a portion of the electromagnetic spectrum that includes one or more of: the UVA electromagnetic spectrum having wavelengths falling between approximately 315 nanometers (nm) and approximately 400 nm; the UVB electromagnetic spectrum having wavelengths falling between approximately 280 nm and approximately 315 nm; and/or the UVC electromagnetic spectrum having wavelengths falling between approximately 200 nm and approximately 280 nm.

As used herein, the term "optical axis" when used in reference to an optical device refers to the optical centerline through the center of one or more lenses comprising least a portion of the optical device.

As used herein, the term "longitudinal axis" when used in reference to a device refers to an axis through the longest or greatest dimension of the device. Thus, for a rectangular object, the "longitudinal axis" would refer to an axis parallel to the longest side of the rectangle. For an ellipse, the "longitudinal axis" would refer to an axis extending through (i.e., collinear with) the major axis of the ellipse.

As used herein, the term "lateral axis" when used in reference to a device refers to an axis through the shortest or smallest dimension of the device. Thus, for a rectangular object, the "lateral axis" would refer to an axis parallel to the shortest side of the rectangle. For an ellipse, the "lateral axis" would refer to an axis extending through (i.e., collinear with) the minor axis of the ellipse.

FIG. 1 depicts an illustrative dual-spectrum image intensification system 100 that includes an enhanced vision system 102 that incorporates a image intensifier 110 that includes a thin-film deposited phosphor screen 140, in accordance with at least one embodiment described herein. As depicted in FIG. 1, the enhanced vision system 102 receives photons reflected by an object 160 within the field of view 114 of the enhanced vision system 102. In embodiments, the photons may include photons 122 in a first spectral band (e.g., the visible portion between 390 nanometers (nm) and 700 nm). The enhanced vision system 102 may include an objective lens array 104 to collect and focus the photons 122 on a photocathode 120. The enhanced vision system 102 may further include an eyepiece 106 to display an enhanced image 170 produced by the image intensifier 110. In embodiments, the enhanced image 170 may include an image containing one or more objects 172 emitting and/or reflecting photons 122 in the first spectral band.

The image intensifier 110 includes at least a photocathode 120, a microchannel plate 130, and a phosphor screen 140. The photocathode 120 includes a photodetector array 126 that uses at least one first optoelectronic material that generates photo-electrons in response to incoming photons 122 in the first spectral band. In embodiments, the photocathode 120 may include any number of additional optoelectronic materials that are layered above or below or patterned on or about the first optoelectronic material. In response to incoming photons 122 the photocathode 120 generates and/or emits photo-electrons that impinge, impact or otherwise strike a photomultiplier, such as the microchannel plate (MCP) 130. The impact of the photo-electrons with channel walls in the microchannel plate 130 generates tens, hundreds, or even thousands of secondary electrons. These secondary electrons generated in or by the microchannel plate 130 depart the surface of the microchannel plate 130 and impact the thin-film phosphor layer of the phosphor screen 140 where the energy of the secondary electrons is converted back to an intensified or enhanced photonic output having a wavelength based upon the phosphorescent material used in forming the phosphor layer.

The system user is able to view the enhanced image output from the phosphor screen 140 via eyepiece 106. The eyepiece 106 displays an intensified, image 170 that includes objects 160 disposed in the field-of-view 114 of the enhanced vision system 102.

Figure 2:
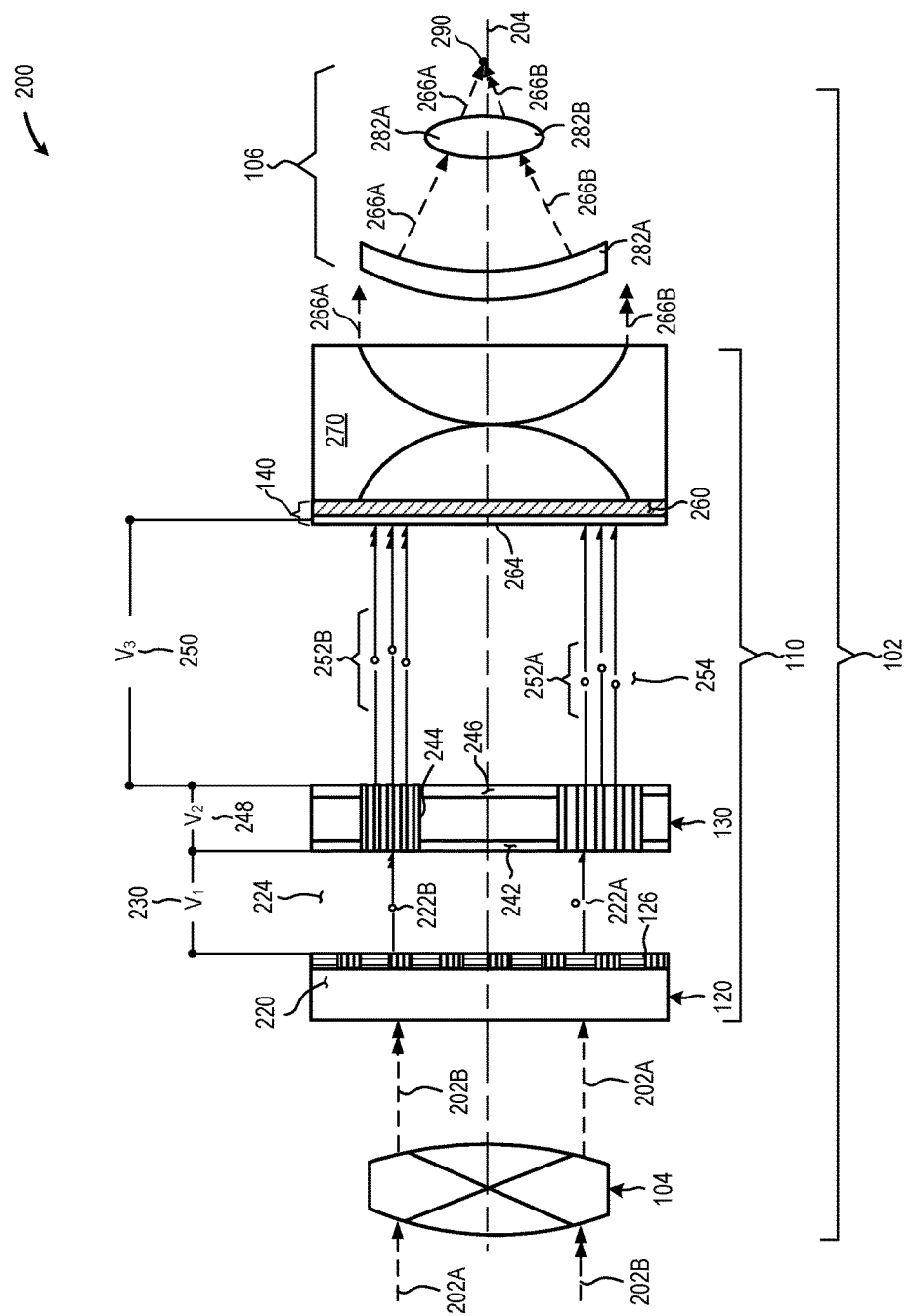
FIG. 2 is a cross-sectional elevation of an illustrative enhanced vision system that includes an image intensifier using a thin-film deposited phosphor layer forming at least a portion of the phosphor screen 140, in accordance with at least one embodiment described herein.

FIG. 2 is a cross-sectional elevation of an illustrative enhanced vision system 200 that includes an image intensifier 110 using a thin-film deposited phosphor layer 260 forming at least a portion of the phosphor screen 140, in accordance with at least one embodiment described herein. The enhanced vision system 200 includes an objective lens 104, the image intensifier 102, an image re-inverter 270, and an eyepiece 106, in accordance with at least one embodiment described herein. In embodiments, the objective lens 104, image intensifier 102, image re-inverter 270, and eyepiece 106 may be disposed on or along a common optical axis 204.

Ambient electromagnetic energy, for example photons 202A and 202B in a first spectral band enter the objective lens 104 of the enhanced vision system 200. In embodiments, the objective lens 104 inverts the image and the photons 202A and 202B exit the objective lens 104. In embodiments, the objective lens 104 may include one or more simple or compound lenses. The objective lens 104 may be fabricated from one or more materials that include, but are not limited to, fiber-optic fibers, quartz ($SiO_2$), borosilicate glass, fused silica, sapphire glass ($Al_2O_3$), magnesium fluoride ($MgF_2$), calcium fluoride ($CaF_2$) and similar. The objective lens 104 may be transparent or semitransparent to energy in at least a portion of the visible portion of the electromagnetic spectrum. The objective lens 104 may be transparent or semitransparent to energy in at least a portion of the near infrared (NIR) or short-wave infrared (SWIR) portion of the electromagnetic spectrum. The objective lens 104 may be transparent or semitransparent to energy in at least a portion of the near ultraviolet portion of the electromagnetic spectrum.

In embodiments, the objective lens 104 may include and/or incorporate one or more coatings, layers, shutters or similar devices or systems capable of selectively limiting the amount of electromagnetic energy (i.e., photons 202A and/or 202B) entering the enhanced vision system 200. In some implementations, the one or more shutters may limit the amount of electromagnetic energy entering only a portion of the objective lens 104 (e.g., limiting the amount of electromagnetic energy produced by a street light, brightly lit indoor scene, or similar intense light source entering the objective lens). The one or more shutters may include a mechanical shutter, an electrochromic shutter, an electromechanical shutter, or any combination thereof. In embodiments, the one or more shutters or similar devices may limit the transmission of a portion of the electromagnetic spectrum through the objective lens 104. For example, the one or more shutters may include one or more layers that block all or a portion of the infrared electromagnetic spectrum (e.g., electromagnetic spectrum having wavelengths greater than 700 nanometers) from passage through the objective lens 104.

The photons 202A and 202B pass through the objective lens 104 and impinge upon the photocathode 120. The photocathode 120 selectively generates photo-electrons 222A and 222B in response to the impact of photons 202A and 202B having a sufficient energy level. As depicted in FIG. 2, the photocathode 120 generates photo-electrons 222A and 222B in response to photons 202A and 202B, respectively, impinging upon the photodetector array 126 with a sufficient energy level. In embodiments, the photocathode 120 may be formed, patterned, transferred, deposited, or otherwise disposed on or across all or a portion of a surface of the objective lens 104. In embodiments, the photocathode 120 may be formed, patterned, transferred, deposited, or otherwise disposed on, about, or across at least a portion of an entrance window to the image intensifier 110.

In embodiments, the photodetector array 126 may include any number and/or combination of binary compounds, ternary compounds, and/or quaternary compounds. The photodetector array 126 may include multiple optoelectronic materials disposed in layers and/or patterned onto each other and/or a substrate to provide the photocathode 120. Example binary compounds include, but are not limited to: indium phosphide, InP; gallium arsenide, GaAs; silver oxide, $Ag_2O$; cobalt oxide, CoO; gold oxide $Au_2O_3$; platinum oxide, $PtO_2$; and cuprous oxide; $Cu_2O$. Example ternary compounds may include, but are not limited to: indium gallium arsenide, InGaAs; silver oxide cesium, AgOCs; antimony oxide cesium, CsSbO). Example quaternary compounds include, but are not limited to: indium gallium arsenide phosphide, InGaAsP; bismuth silver oxide cesium, BiAgOCs.

The photocathode 120 includes any number and/or combination of systems and/or devices capable of vacuum photoemission by emitting photo-electrons 222A, 222B into the vacuum space 224 that separates the dual-spectrum photodetector 120 from the microchannel plate 130. The photocathode 120 may include any number and/or combination of structures and/or materials capable of providing vacuum emitting photo-electrons 222. The photocathode 120 includes a photodetector array 126 formed using at least one first optoelectronic material capable of generating photo-electrons 222A and 222B in response to the impact of incident electromagnetic energy and/or photons 202A and 202B. Although only two optoelectronic materials are depicted as layered or patterned in FIG. 2 for ease of discussion and conciseness, one of ordinary skill in the relevant arts will appreciate that any number of layers of optoelectronic materials and/or any number of patterned optoelectronic materials may be similarly layered or patterned to provide the photocathode 120—such embodiments should be considered as falling within the scope of this disclosure.

The optoelectronic material that forms the photodetector array 126 may be deposited, patterned, or otherwise formed as uniform layer or in a random or uniform pattern. In embodiments, the optoelectronic material may be disposed proximate the substrate 220. One or more coatings or layers (not depicted in FIG. 2), such as an atomic layer of cesium oxide ($Cs_2O$), may be deposited, patterned, or otherwise applied to the photocathode 120 to facilitate the departure of photo-electrons 222A, 222B from the photocathode 120 and into the first vacuum space 224.

The optoelectronic material forming the photodetector array 126 may include one or more binary materials, one or more ternary materials, one or more quaternary materials, or combinations thereof. In embodiments, the ratio of one or more binary, ternary, or quaternary constituents may be adjusted or altered to adjust the absorption spectra of the first optoelectronic material. In at least one embodiment, the optoelectronic material may include, but is not limited to, one or more materials containing: indium phosphide (InP), indium-gallium phosphide (InGaP), gallium arsenide (GaAs), gallium nitride (GaN), and/or gallium-arsenide phosphide (GaAsP). In embodiments, the composition of the optoelectronic material may be adjusted based, at least in part, on a desired photon absorption range. In some embodiments, the optoelectronic material may be applied, patterned, formed, or otherwise disposed on, across, or about all or a portion of the surface of the substrate 220. In some embodiments, the optoelectronic material may be patterned, formed, or otherwise deposited on a transfer medium. The transfer medium carrying the optoelectronic material may be applied to the substrate 220 and removed, leaving behind the optoelectronic material on the substrate 220. The optoelectronic material may have a uniform or non-uniform composition. The optoelectronic material may have a uniform or non-uniform thickness across all or a portion of the surface of the substrate 220. In embodiments, the thickness of the optoelectronic material may be selected to provide a desired absorption spectrum. The optoelectronic material may have a thickness of: about 0.01 micrometers ($\mu m$) to about 1 $\mu m$; about 0.01 $\mu m$ to about 5 $\mu m$; about 0.01 $\mu m$ to about 10 $\mu m$; or about 0.01 $\mu m$ to about 20 $\mu m$.

In embodiments, the optoelectronic layer may include a plurality of layers and an interposer layer that includes one or more electrically conductive materials may be deposited between some or all of the layers. In other embodiments, the optoelectronic layer may include a plurality of layers and an interposer layer that includes one or more dielectric materials may be deposited between some or all of the layers.

The substrate 220 may include one or more carbides, one or more oxides, or combinations thereof. In some embodiments, the material(s) used to provide the substrate 220 may be selected such that the lattice structure of the substrate 220 closely matches the lattice structure of the material(s) used to form the photodetector array 126. For example, in some embodiments, the substrate 220 may include: magnesium fluoride ($MgF_2$); calcium fluoride ($CaF_2$); silicon carbide (SiC); quartz ($SiO_2$); or sapphire glass ($Al_2O_3$). In at least some embodiments, the substrate 220 may include all or a portion of the entrance window of the image intensifier 102.

The dual-spectrum photocathode 120 and the microchannel plate 130 are physically separated by a first vacuum space 224 maintained at a pressure below atmospheric pressure. In embodiments, the first vacuum space 224 may be maintained at a vacuum. A first potential difference (voltage $V_1$) 230 is applied across the photocathode 120 and a first electrode 242 on the surface of the microchannel plate 130 nearest the dual-spectrum photocathode 120. The first potential difference 230 may be maintained at a voltage of from about 100 Volts to about 1200 Volts. Maintaining the first potential difference 230 between the photocathode 120 and the first electrode 242 creates an electric field in the vacuum space 224 that separates the photocathode 120 and the first electrode 142. The electric field in the vacuum space 224 assists in causing the photo-electrons 222A and 222B to depart the surface of the dual-spectrum photocathode 120 into the vacuum space 224 and accelerating the photo-electrons 222A and 222B through the vacuum space 224 towards the first electrode 242 disposed on the surface of the microchannel plate 130.

The microchannel plate 130 includes the first electrode 242 disposed on the surface of the microchannel plate 130 nearest the dual-spectrum photocathode 120 and a second electrode 246 disposed on the surface of the microchannel plate 130 nearest the phosphor screen 140. The first electrode 242 and the second electrode 246 are maintained at different voltages, creating a second potential difference (second voltage $V_2$) 248. The second potential difference 248 may be maintained at a voltage of from about 400 Volts to about 1200 Volts.

A plurality of microchannels 244 extend through the microchannel plate 130. The microchannels 244 may have a diameter of from about 3 micrometers (μm) to about 25 μm. The microchannels 244 may be on a pitch (i.e., center-to-center distance) of from about 4 micrometers (μm) to about 32 μm. In some embodiments, the microchannels 244 may extend normally (i.e., at a 90° angle with respect to the surface of the microchannel plate 130) through the microchannel plate 130. In some embodiments, the microchannels 244 may extend at an angle (i.e., at less than a 90° angle with respect to the surface of the microchannel plate 130) through the microchannel plate 130.

The photo-electrons 222A and 222B emitted by the photocathode 120 enter microchannels 244 formed in the microchannel plate 130. As the photo-electrons 202A and 202B travel through the microchannels 244 and impact the interior walls of the channel, secondary electrons are generated. At least some of the secondary electrons collide with the interior wall of the microchannel 244 causing the generation of additional secondary electrons 252A and 252B (collectively, "secondary electrons 252"). The impact of the photo-electrons 222A and 222B emitted by the photocathode 120 thus cause the generation of tens, hundreds, or even thousands of secondary electrons 252, at least a portion of which exit the microchannel plate 130.

The secondary electrons 252 depart the surface of the microchannel plate 130, pass through a second vacuum space 254, and impact the phosphor layer 260 portion of the phosphor screen 140. In embodiments, a third potential difference (voltage $V_3$) 250 creates an electric field in the second vacuum space 254 that accelerates the secondary electrons 252 toward the phosphor screen 140. The phosphor screen 140 includes a phosphor layer 260 and a conductive layer 262. In embodiments, the third potential difference 250 is applied across the second electrode 246 on the surface of the microchannel plate 130 and the conductive layer 262 disposed on the phosphor screen 140. The third potential difference 250 may be maintained at a voltage of from about 2500 Volts to about 6000 Volts.

The electric field in the second vacuum space 254 causes the secondary electrons 252 to accelerate toward the phosphor layer 260 of the phosphor screen 140. The impact of the secondary photo-electrons 252 on the phosphor layer 260 causes the emission of photons 266A and 266B (collectively, "photons 266"). In embodiments, photons 266A and 266B which correspond to original photons 202A and 202B, respectively. Due to the multiplier effect of the microchannel plate 130, a single incident photon 202 may result in the generation of hundreds or even thousands of photons 266 by the phosphor screen 140. In embodiments, the photons 266A and 266B emitted by the phosphor layer 260 may be at a wavelength based, at least in part on the compound(s) included in and/or forming the phosphor layer 260.

The phosphor layer 260 may include one or more phosphorescent materials. Such phosphorescent materials may include, but are not limited to: one or more yttrium-based phosphors (P22R, P45, P46, P47, P53, etc.); one or more zinc-based phosphors (P4, P7, P11, P12, P15, P17, P22G, P22B, P31, P38, P39, P40, etc.); and one or more gadolinium-based phosphors (P43, etc.). In one or more embodiments, the phosphor layer 260 may include a yttrium-oxysulfide phosphor doped with either europium ($Y_2O_2S$:Eu) or terbium ($Y_2O_2S$:Tb).

The conductive layer 262 may be deposited on, about, or across all or a portion of the phosphor layer 260. The conductive layer 262 may provide an earth or chassis ground to drain the accumulated electrical charge from the flow of secondary electrons 252A, 252B from the phosphor layer 260. The conductive layer 262 may include one or more electrically conductive metals or metal alloys such as aluminum, silver, platinum, and the like. The conductive layer 262 may be disposed across all or a portion of the phosphor layer 260 using one or more currently available or future developed thin-layer deposition techniques. In embodiments, the use of thin-film deposition to form the phosphor layer 260 beneficially provides a crystalline structure and/or surface morphology that facilitates efficient removal of accumulated charge using a relatively thin conductive layer 262. Such represents a significant cost and performance advantage over manually applied phosphors previously used to provide the phosphor layer 260.

The image emitted by the phosphor screen 140 is inverted. The image re-inverter 270 re-inverts the image formed by the photons 266A, 266B emitted by the phosphor layer 260 such that the enhanced vision system 200 presents an image in the correct orientation (i.e., right side up) to the system user. Although not depicted in FIG. 2, In some implementations, all or a portion of the phosphor layer 260 may be deposited directly on or across the image re-inverter 270. In one embodiment, the image re-inverter 270 may include, but is not limited to, a plurality of twisted fiber-optic elements and the phosphor layer 260 may be deposited directly on an inlet end of at least some of the plurality of fiber-optic elements forming the image re-inverter 270.

The image-re-inverter 270 can include any number and/or combination of active and/or passive devices and/or systems capable of inverting the image provided by the phosphor screen 140. In implementations, the image re-inverter 270 may include any number and/or combination of prisms, mirrors, lenses or similar passive optics. In other implementations, the image re-inverter 270 may include a fiber-optic bundle that is twisted through an arc of 180°. The photons 266, now correctly displayed as a "right side up" image 170, are presented to the system user via the eyepiece 106.

The eyepiece 106 focuses the image provided by the phosphor screen 140 on a focal plane 290 that corresponds to the system user's eye. The eyepiece 106 may include one or more simple or compound lenses 282A and 282B (collectively, "lenses 282"). In some implementations, the eyepiece 106 may be adjustable display an enhanced image of the object 160 at a focal point 290 of the eyepiece 106.

Figure 3:
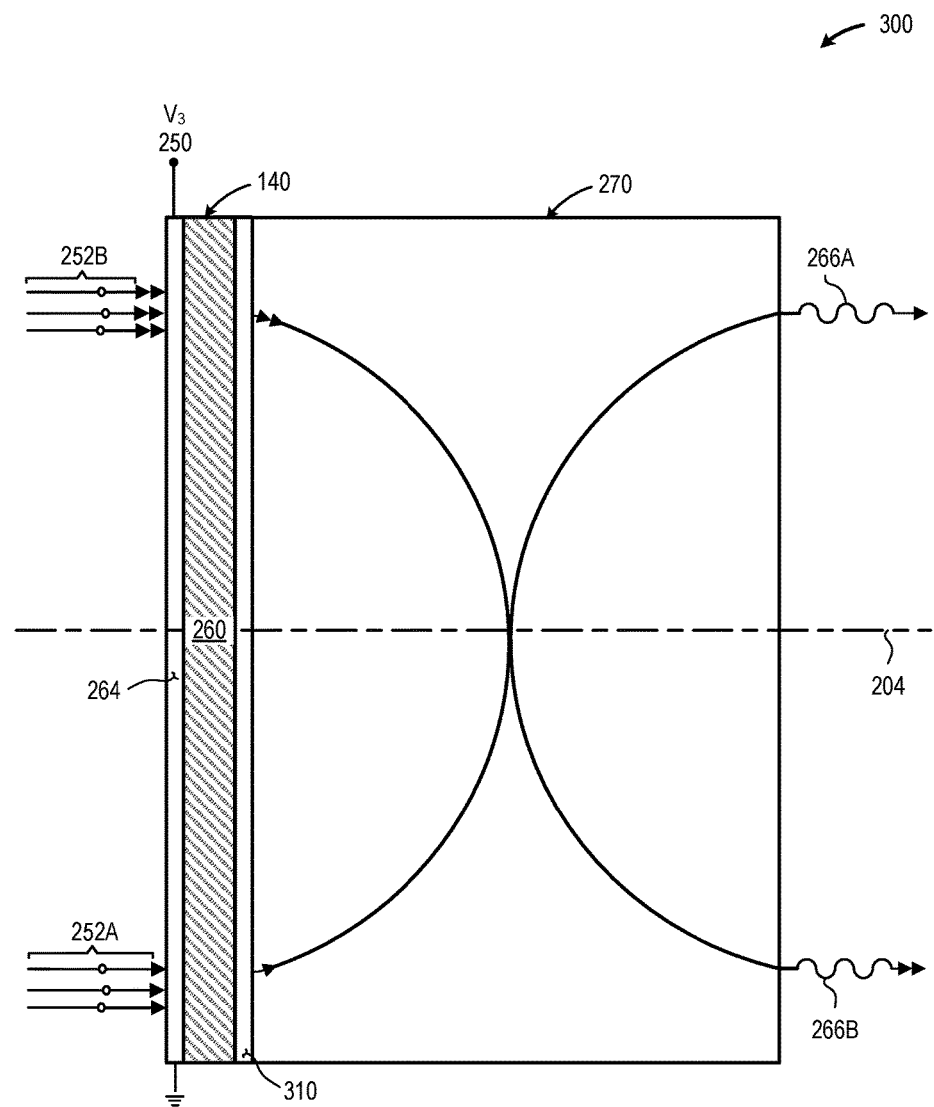
FIG. 3 is a schematic diagram of an illustrative system that includes a phosphor screen having a thin-film deposited phosphor layer operably coupled to an image re-inverter such as used with the enhanced vision system depicted in FIG. 2, in accordance with at least one embodiment described herein.

FIG. 3 is a schematic diagram of an illustrative system 300 that includes a phosphor screen 140 operably coupled to an image re-inverter 270 such as used with the enhanced vision system 200 depicted in FIG. 2, in accordance with at least one embodiment described herein. The photoelectrons 252A, 252B emitted by the microchannel plate 150, pass through the conductive layer 264 and impinge upon the phosphor layer 260. In response, the phosphor layer 260 emits photons 266A, 266B. The image re-inverter 270 inverts the image from the phosphor screen 260 such that the image presented to the user is correctly oriented, i.e., right-side up.

In embodiments, the phosphor screen 260 may be deposited or otherwise formed directly on a surface of the image re-inverter 270. In other embodiments, the phosphor screen 260 may be formed on a separate substrate 310 that may be disposed proximate the image re-inverter 270. In implementations where the phosphor screen 260 is formed directly on the surface of the image re-inverter 270, one or more surface preparations may be performed on the surface of the image re-inverter 270.

The phosphor screen 260 includes a phosphor layer 260 and a conductive layer 264 that is maintained at the third voltage 250 with respect to the microchannel plate 150. The phosphor layer 260 may include one or more photoluminescent compounds that phosphoresce (i.e., generate and emit one or more photons) when impacted by the photoelectrons 252 exiting from the microchannel plate 150.

In embodiments, the phosphor layer 260 may include yttrium-oxysulfide. In embodiments, the yttrium-oxysulfide may include europium (Eu—$Y_2O_2S$:$Eu^{+3}$), such as P22R. A europium activated yttrium-oxysulfide phosphor provides a red to red-orange output at wavelengths of about 616 nanometers (nm) and about 626 nm. The decay time of a europium activated yttrium-oxysulfide phosphor 162 may range from about 500 microseconds (μs) to about 2500 μs. The color of the output of the europium activated yttrium-oxysulfide phosphor may be adjusted by varying the europium content of the phosphor from an Eu/Y molar ratio of about 0.02 to about 0.06. Increasing Eu content (i.e., the molar ratio of Eu/Y from 0.02 to 0.06) generally shifts color output to a redder output and decreased overall photon emission.

In other embodiments, the phosphor layer may include yttrium-oxysulfide that includes a terbium (Tb—$Y_2O_2S$:Tb), such as P45. A terbium activated yttrium-oxysulfide phosphor provides a bluish-white output at wavelengths of about 485 nanometers (nm), 545 nm, 587 nm, and 620 nm. The terbium content of the Tb activated yttrium-oxysulfide phosphor layer 162 affects the output intensity of the phosphor screen 160. Generally, increasing the concentration of terbium in the Tb activated yttrium-oxysulfide phosphor layer 162 increases the output intensity of the phosphor screen 160. In embodiments, the Tb activated yttrium-oxysulfide phosphor layer 162 may have a terbium content of from: about 0.01 mole percent (mol %) to about 0.1 mol %. The specific discussion of Eu and Tb activated yttrium-oxysulfide phosphors does not exclude the use of other phosphors and is intended only to provide a single embodiment as a non-limiting example.

The phosphor layer 260 may be formed, patterned, deposited, transferred, or otherwise disposed on all or a portion of the surface of the substrate 310 or on all or a portion of the surface of the image re-inverter 270 using any currently available or future developed thin-film deposition technique. Example thin-film deposition techniques include, but are not limited to: chemical solution deposition (CSD); chemical bath deposition (CBD); chemical vapor deposition (CVD); plasma enhanced chemical vapor deposition (PECVD); atomic layer deposition (ALD); physical vapor deposition (PVD); molecular beam epitaxy (MBE); sputtering; pulsed laser deposition; cathodic arc deposition (arc-PVD); and similar. The thin-film deposited phosphor layer 260 may be applied as a thin-film having a thickness of from: about 1 nanometer (nm) to about 2000 nm; about 1 nm to about 1500 nm; about 1 nm to about 1000 nm; about 1 nm to about 500 nm; or about 1 nm to about 100 nm.

Once deposited as a thin-film, phosphor layer 260 beneficially provides a crystalline structure having a surface morphology that facilitates the deposition of a relatively thin conductive layer 264. In embodiments, the thin-film deposited phosphor layer 260 may have a peak-to-valley (PV) surface roughness of from: about 0.5 nanometers (nm) to about 100 nm; about 0.5 nm to about 50 nm; about 0.5 nm to about 20 nm; about 0.5 nm to about 10 nm; or about 0.5 nm to about 1 nm. In embodiments, the thin-film deposited phosphor layer 260 may have a root-men-square (rms) surface roughness of from: about 0.3 nanometers (nm) to about 5 nm; about 0.3 nm to about 3 nm; about 0.3 nm to about 2 nm; about 0.3 nm to about 1 nm; or about 0.3 nm to about 0.5 nm. The relative smoothness of the phosphor layer 260 beneficially limits the quantity of conductive material used in the conductive layer 264 since smaller peaks-and-valleys in the thin-film deposited phosphor require less conductive material to fill than larger peaks-and-valleys to provide a continuous conductive coating across the phosphor layer 260.

The third potential difference ($V_3$) 250 is maintained between the exit surface 246 of the microchannel plate 130 and the conductive layer 264 disposed across the surface of the phosphor screen 140. In embodiments, the conductive layer 264 may be at a potential of zero volts with respect to an earth or chassis ground potential (i.e., the conductive layer 264 may be earth or chassis "grounded"). The third potential difference ($V_3$) 250 creates the third electric field 254 between the exit surface 246 of the microchannel plate 140 and the conductive layer 264. In embodiments, the conductive layer 264 assists in dissipating any accumulated charge on the conductive layer 264. The conductive layer 264 may include any number, type, and/or combination of materials capable of providing an electrically conductive and electrically continuous layer on or across all or a portion of the phosphor layer 260. In embodiments, the conductive layer 264 may include an aluminum layer that provides, an electrode to generate the third electric field 254, a reflective surface capable of redirecting photons generated in the phosphor layer 260 toward the image re-inverter 270, and a blocking layer that prevents photons generated by the phosphor layer 260 from re-entering the vacuum space between the microchannel plate 130 and the phosphor screen 140.

In embodiments, all or a portion of the secondary electrons 252 exiting the microchannel plate 130 pass through the conductive layer 264 prior to impacting the phosphor layer 260. Photons 266 are emitted when the secondary electrons 252 impact the phosphor layer 260. In embodiments, each secondary electron impact may cause the emission of a plurality of photons 266 by the phosphor layer 260. For example, 10 to 200 photons may be emitted by the phosphor layer 260 for each secondary electron impact. At least a first portion of the photons 266 emitted by the phosphor layer 260 may pass through the image re-inverter 270. At least a second portion of the photons 266 emitted by the phosphor layer 260 may initially be directed backwards, towards the microchannel plate 130. In embodiments, the conductive layer 264 may reflect some or all of the second portion of the photons 266 emitted by the phosphor layer 260, causing the photons 266 emitted in a direction towards the microchannel plate 130 to be redirected in an opposite direction (i.e., towards the image re-inverter 270).

The conductive layer 264 may include a thin-layer containing one or more electrically conductive metals or metal alloys that permit the passage of secondary electrons 252 but reflect at least a portion of the photons 266 emitted by the phosphor layer 260. In embodiments, the conductive layer 264 may include one or more electrically conductive metals or metal alloys disposed in a carrier resin or similar substance. In such embodiments, the conductive layer 264 may include one or more electrically conductive nanowires or similar solid or hollow nanostructures disposed in a carrier polymer or resin. In embodiments, the conductive layer 264 may preferentially provide greater electrical resistance in a first direction than in a second direction. In embodiments, the conductive layer 264 may include an aluminum or aluminum alloy disposed in a thin-layer across the surface of the phosphor layer 260. The conductive layer 264 may have a thickness of from: about 1 nanometer (nm) to about 1000 nm; about 1 nm to about 700 nm; about 1 nm to about 500 nm; about 1 nm to about 300 nm; or about 1 nm to about 100 nm.

Figure 4:
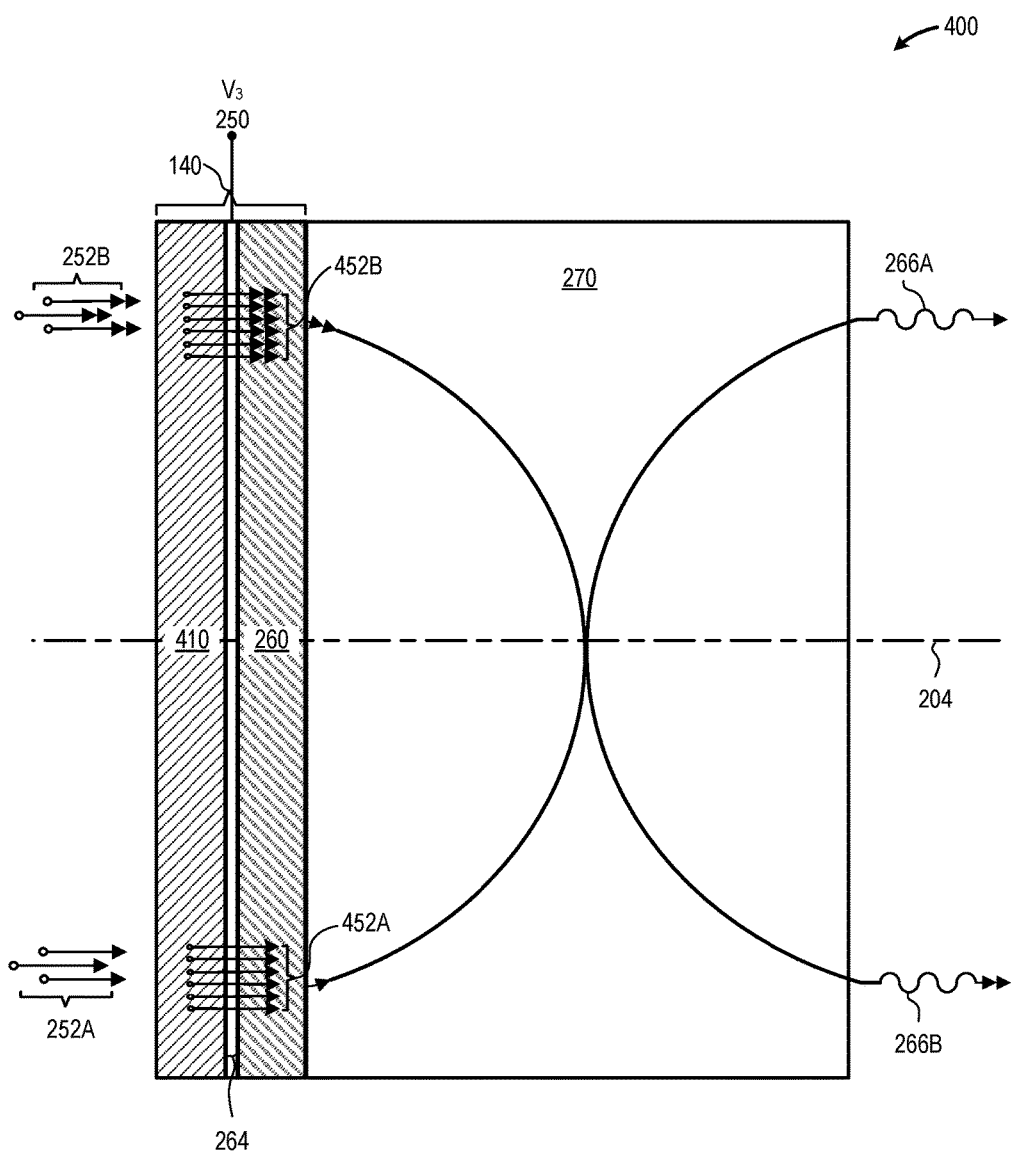
FIG. 4 is a schematic diagram of an illustrative system that includes a phosphor screen having a thin-film deposited phosphor layer and one or more secondary electron emitter layers, operably coupled to an image re-inverter such as used with the enhanced vision system depicted in FIG. 2, in accordance with at least one embodiment described herein.

FIG. 4 is a schematic diagram of an illustrative system 400 that includes a phosphor screen 140, that includes one or more secondary electron emitter layers 410, operably coupled to an image re-inverter 270 such as used with the enhanced vision system 200 depicted in FIG. 2, in accordance with at least one embodiment described herein. The photoelectrons 252A, 252B emitted by the microchannel plate 130, pass through the secondary electron emitter layer 410. Within the secondary electron emitter layer 410, the incident secondary electrons 252 cause the generation and emission of additional electrons 452A and 452B (collectively, "electrons 452"). The electrons 452 pass through the conductive layer 264 and impinge upon the secondary phosphor layer 260. In response, the phosphor layer 260 emits photons 266A, 266B. The increased number of electrons 452 striking the phosphor layer 260 generates additional photons 266 improving the brightness, contrast, and/or clarity of the image 170 presented to the system user. The image re-inverter 270 inverts the image from the phosphor screen 140 such that the image presented to the user is correctly oriented, i.e., right-side up.

In embodiments, the one or more secondary electron emitter layer(s) 410 may be deposited, patterned, transferred, or otherwise disposed in, on, about, or across all or a portion of the conductive layer 264. The secondary electron emitter layer 410 may be deposited using any currently available or future developed material deposition process or method. In embodiments the secondary electron emitter layer 410 may include one or more layers deposited using a thin-film deposition process. Example thing-film deposition processes include, but are not limited to: but are not limited to: chemical solution deposition (CSD); chemical bath deposition (CBD); chemical vapor deposition (CVD); plasma enhanced chemical vapor deposition (PECVD); atomic layer deposition (ALD); physical vapor deposition (PVD); molecular beam epitaxy (MBE); sputtering; pulsed laser deposition; cathodic arc deposition (arc-PVD); and similar. In embodiments, the secondary electron emitter layer 410 may include one or more materials deposited or otherwise patterned onto all or a portion of the conductive layer 264. For example, in one embodiments, the secondary electron emitter layer 410 may include "dots" or "bumps" of secondary electron emitting material patterned on the conductive layer 264 in locations corresponding to locations of the individual fiber optic strands forming a fiber-optic image re-inverter 270.

The secondary electron emitter layer 410 may include one or more materials capable of generating secondary electrons in response to at least a portion of the incident secondary electrons 252 emitted by the microchannel plate 130. In embodiments, the secondary electron emitter layer 410 may include: aluminum oxide ($Al_2O_3$) and/or magnesium oxide (MgO). The secondary electron emitter layer 410 may have a thickness of from: about 1 nanometers (nm) to about 1000 nm; about 1 nm to about 700 nm; about 1 nm to about 500 nm; about 1 nm to about 300 nm; or about 1 nm to about 100 nm.

Figure 5:
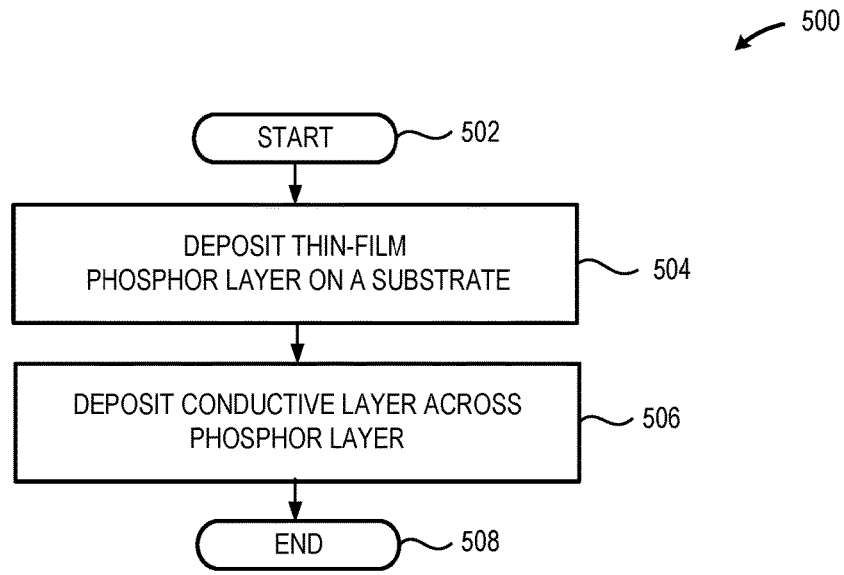
FIG. 5 is a high-level flow diagram of an illustrative method of producing an enhanced vision device that includes a phosphor screen having at least one thin-film phosphor layer deposited using a thin-film deposition technique such as depicted and described in FIGS. 1 through 4, in accordance with at least one embodiment described herein.

FIG. 5 is a high-level flow diagram of an illustrative method 500 of producing an enhanced vision device that includes a phosphor screen 140 having at least one phosphor layer 260 deposited using a thin-film deposition technique such as depicted and described in FIGS. 1 through 4, in accordance with at least one embodiment described herein. In embodiments, the surface morphology (e.g., the roughness, profile, or similar physical characteristics of the finished phosphor layer 260) of a phosphor deposited using thin-layer deposition process may provide a surface having favorable surface roughness properties for the deposition of a relatively thin conductive layer 264 thereupon. The use of a relatively thin conductive layer 264 beneficially and advantageously limits the buildup of an electrostatic charge on the phosphor layer 260, thereby improving enhanced vision device 100 performance. Further, the use of a relatively thin conductive layer 264 may also reduce the voltage (V3) between the microchannel plate 130 and the phosphor screen 140, beneficially reducing the energy consumption of the enhanced vision device. The method 500 commences at 502.

At 504, a phosphor layer 260 is deposited on a substrate 210. In embodiments, the phosphor layer 260 may be formed, patterned, transferred, deposited, or otherwise disposed on, about, or across at least a portion of a substrate 210 that includes one or more optically transparent materials. In other embodiments, the phosphor layer 260 may be formed, patterned, transferred, deposited, or otherwise disposed on, about, or across at least a portion of the image re-inverter 270. For example, the phosphor layer 260 may be patterned onto the image re-inverter 270 such that the material forming the phosphor layer is deposited at locations corresponding to the end of each of the fiber optic strands forming a twisted fiber optic bundle image re-inverter 270.

The phosphor layer 260 may be deposited using any currently available or future developed thin-film deposition technique. Example thin-film deposition techniques include, but are not limited to: chemical solution deposition (CSD); chemical bath deposition (CBD); chemical vapor deposition (CVD); plasma enhanced chemical vapor deposition (PECVD); atomic layer deposition (ALD); physical vapor deposition (PVD); molecular beam epitaxy (MBE); sputtering; pulsed laser deposition; cathodic arc deposition (arc-PVD); and similar. In some embodiments, the thin-film phosphor layer 260 may include a thin-layer deposited, europium-activated, yttrium-oxysulfide-based phosphor layer. In some embodiments, the thin-film phosphor layer 260 may include a thin-layer deposited, terbium-activated, yttrium-oxysulfide phosphorescent layer.

At 506, a conductive layer 264 is deposited across at least a portion of the thin-film deposited phosphor layer 260. The crystalline structure and surface morphology of thin-film deposited phosphor layer 260 facilitates the deposition of a relatively thin conductive layer 264. In embodiments, the conductive layer 264 permits the passage of at least a portion of the secondary electrons 252 emitted by the microchannel plate 130 while beneficially reflecting at least a portion of the photons emitted by the phosphor layer 260 (i.e., a portion of those photons emitted towards the microchannel plate 130).

The conductive layer 264 may include any electrically conductive material including, but not limited to, one or more electrically conductive metals (aluminum, etc.), one or more electrically conductive metal alloys (indium tin oxide—ITO, etc.), one or more electrically conductive polymers (silver nanowires on a polyethylene terephthalate substrate, etc.), one or more electrically conductive non-metals (graphene, carbon nanotubes, etc.), or combinations thereof. The method 500 concludes at 508.

Figure 6:
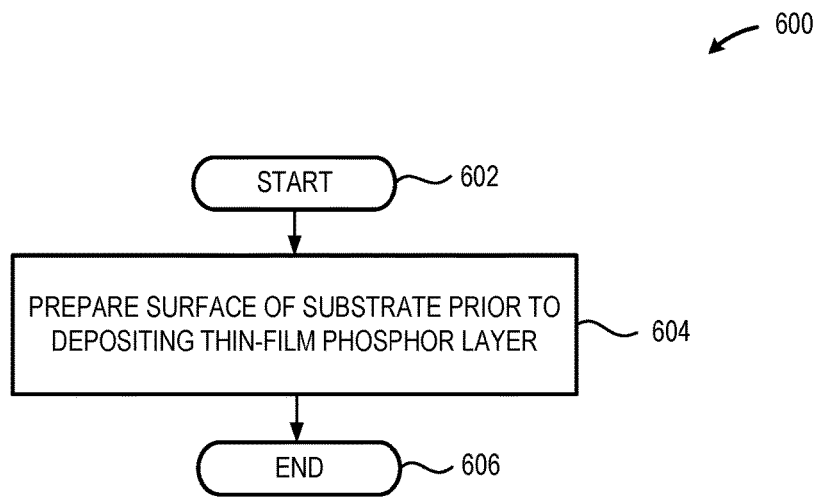
FIG. 6 is a high-level flow diagram of an illustrative method of producing an enhanced vision device that includes a phosphor screen having at least one thin-film phosphor layer deposited using a thin-film deposition technique such as depicted and described in FIGS. 1 through 4, in accordance with at least one embodiment described herein.

FIG. 6 is a high-level flow diagram of an illustrative method 600 of producing an enhanced vision device that includes a phosphor screen 140 having at least one phosphor layer 260 deposited using a thin-film deposition technique such as depicted and described in FIGS. 1 through 4, in accordance with at least one embodiment described herein. The method 600 may be used in conjunction with the method 500 depicted in FIG. 5. The thin-film phosphor layer 260 may be formed, deposited, patterned, transferred, or otherwise disposed on a substrate 210 or on at least a portion of the inlet surface of the image re-inverter 270. In either instance, one or more surface preparations may be applied to the substrate 210 or the inlet surface of the image re-inverter 270. The one or more surface preparations may improve the adhesion of the phosphor layer 260 to the substrate 210 or inlet surface of the image re-inverter 270. The one or more surface preparations may improve the performance of the thin-film phosphor layer 260. The method 600 commences at 602.

At 604, the surface of the substrate 210 receives one or more surface preparations prior to deposition of the thin-film phosphor layer 260. In other embodiments, the surface of the inlet surface of the image re-inverter 270 receives one or more surface preparations prior to deposition of the thin-film phosphor layer 260. In embodiments, the one or more surface preparations may include one or more mechanical etching and/or one or more chemical etching processes. In some implementations, the one or more surface preparations may include one or more mechanical polishing processes and/or one or more chemical polishing processes. The method 600 concludes at 606.

While FIGS. 5 and 6 are included to illustrate operations according to different embodiments, it is to be understood that not all of the operations depicted in FIGS. 5 and 6 are necessary for other embodiments. Indeed, it is fully contemplated herein that in other embodiments of the present disclosure, the operations depicted in FIGS. 5 and 6, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. In addition, the given logic flow may be implemented by a hardware element, a software element executed by a processor, or any combination thereof. The embodiments are not limited to this context.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed is:

1. An image intensifier phosphor screen comprising:
    a substrate;
    a phosphor layer that includes at least one thin-film deposited phosphor layer deposited using at least one of: chemical solution deposition (CSD); chemical bath deposition (CBD); chemical vapor deposition (CVD); plasma enhanced chemical vapor deposition (PECVD); atomic layer deposition (ALD); physical vapor deposition (PVD); molecular beam epitaxy (MBE); sputtering; pulsed laser deposition; or cathodic arc deposition (arc-PVD);
        wherein the at least one thin-film deposited phosphor layer includes a thin-film layer having a root-mean-square (RMS) surface roughness of from: about 0.3 nanometers (nm) to about 5 nm disposed across at least a portion of the substrate; and
    a conductive layer having a thickness of less than 500 nanometers (nm) deposited across at least a portion of the phosphor layer.

2. The phosphor screen of claim 1 wherein the thin-film deposited phosphor comprises at least one of: a europium activated yttrium-oxysulfide ($Y_2O_2S:Eu$) based phosphor or a terbium doped yttrium oxysulfide ($Y_2O_2S:Tb$) based phosphor.

3. The phosphor screen of claim 1 wherein the thin-film phosphor layer comprises a thin-film phosphor layer having a thickness of from about 0.3 nanometers (nm) to about 1 nm.

4. The phosphor screen of claim 3 wherein the conductive layer comprises a metallic layer having a thickness of from about 0.1 nanometers (nm) to about 500 nm.

5. The phosphor screen of claim 3 wherein the conductive layer comprises a transparent non-metallic layer having a thickness of about 0.1 nanometers (nm) to about 500 nm.

6. The phosphor screen of claim 1 wherein the substrate comprises an image re-inverter.

7. The phosphor screen of claim 6 wherein the image re-inverter comprises a twisted fiber optic bundle.

8. The phosphor screen of claim 1, further comprising:
a secondary electron emitter layer disposed proximate at least a portion of the conductive layer.

9. The phosphor screen of claim 8 wherein the secondary electron emitter layer comprises a layer that includes one or more metal oxides.

10. The phosphor screen of claim 9 wherein the one or more metal oxides included in the secondary electron emitter layer include at least one of: aluminum oxide ($Al_2O_3$) and magnesium oxide (MgO).

11. The phosphor screen of claim 9 wherein the secondary electron emitter layer comprises a layer having a thickness of from about 0.1 nanometers (nm) to about 100 nm.

12. A method of forming an image intensifier phosphor screen, the method comprising:
depositing, via thin-film deposition that includes at least one of: chemical solution deposition (CSD); chemical bath deposition (CBD); chemical vapor deposition (CVD); plasma enhanced chemical vapor deposition (PECVD); atomic layer deposition (ALD); physical vapor deposition (PVD); molecular beam epitaxy (MBE); sputtering; pulsed laser deposition; or cathodic arc deposition (arc-PVD), a thin-film phosphor layer across at least a portion of a substrate;
wherein the the-thin-film phosphor layer includes a layer having a root-mean-square (RMS) surface roughness of from: about 0.3 nanometers (nm) to about 5 nm; and
depositing a conductive layer having a thickness of less than 500 nanometers (nm) across at least a portion of the thin-film phosphor layer.

13. The method of claim 12 wherein depositing across at least a portion of a substrate, via thin-film deposition, a phosphor layer comprises:
depositing across at least a portion of the substrate a phosphor layer that includes at least one of: a thin-film, europium doped yttrium oxysulfide ($Y_2O_2S$:Eu) based phosphor layer and a thin-film, terbium doped yttrium oxysulfide ($Y_2O_2S$:Tb) based phosphor across at least a portion of the substrate.

14. The method of claim 12 wherein depositing a conductive layer across at least a portion of the phosphor screen comprises:
depositing, across at least a portion of the phosphor layer, a conductive layer that includes a metallic layer having a thickness of from 0.1 nanometers (nm) to 500 nm.

15. The method of claim 12 wherein depositing a conductive layer across at least a portion of the phosphor screen comprises:
depositing, across at least a portion of the phosphor layer, a conductive layer that includes a transparent non-metallic layer having a thickness of about 0.1 nanometers (nm) to about 500 nm.

16. The method of claim 12 wherein depositing, via thin-film deposition, a thin-film phosphor layer across at least a portion of a substrate further comprises:
depositing a thin-film phosphor layer having a thickness of from 0.1 nanometers (nm) to 500 nm.

17. The method of claim 12 wherein depositing a thin-film phosphor layer across at least a portion of a substrate comprises:
depositing a thin-film phosphor layer across at least a portion of an image re-inverter.

18. The method of claim 17 wherein depositing a thin-film phosphor layer across at least a portion of an image re-inverter comprises:
depositing a thin-film phosphor layer across at least a portion of an image re-inverter that includes a twisted fiber optic bundle.

19. The method of claim 12, further comprising:
disposing a secondary electron emitter layer proximate at least a portion of the conductive layer.

20. The method of claim 19 wherein disposing a secondary electron emitter layer proximate at least a portion of the conductive layer further comprises:
disposing a secondary electron emitter layer that includes a layer that includes one or more metal oxides proximate at least a portion of the conductive layer.

21. The method of claim 20 wherein disposing a secondary electron emitter layer that includes a layer that includes one or more metal oxides proximate at least a portion of the conductive layer further comprises:
disposing a secondary electron emitter layer that include at least one of: aluminum oxide ($Al_2O_3$) and magnesium oxide (MgO) proximate at least a portion of the conductive layer wherein the one or more metal oxides included in the secondary electron emitter layer.

22. The method of claim 19 wherein disposing a secondary electron emitter layer proximate at least a portion of the conductive layer comprises:
disposing a secondary electron emitter layer having a thickness of from 0.100 nanometers (nm) to 100 nm proximate at least a portion of the conductive layer.

23. An image intensifier, comprising,
a photocathode;
a multichannel plate having a first surface and a second surface, the first surface of the microchannel plate spaced apart from the photocathode forming a first vacuum space therebetween;
a phosphor screen spaced apart from the second surface of the multichannel plate forming a second vacuum space therebetween, the phosphor screen comprising:
a phosphor layer that includes at least one thin-film deposited phosphor layer deposited using at least one of: chemical solution deposition (CSD); chemical bath deposition (CBD); chemical vapor deposition (CVD); plasma enhanced chemical vapor deposition (PECVD); atomic layer deposition (ALD); physical vapor deposition (PVD); molecular beam epitaxy (MBE); sputtering; pulsed laser deposition; or cathodic arc deposition (arc-PVD) disposed across at least a portion of the substrate;
wherein the at least one thin-film deposited phosphor layer includes a thin-film layer having a root-mean-square (RMS) surface roughness of from: about 0.3 nanometers (nm) to about 5 nm; and
a conductive layer having a thickness of less than 500 nanometers (nm) deposited across at least a portion of the phosphor layer; and a twisted fiber optic bundle having a first end and a second end twisted 180 degrees with respect to the first end, the first end of the twisted fiber optic bundle disposed proximate the phosphorescent display.

24. The image intensifier of claim 23 wherein the thin-film deposited phosphor comprises at least one of: a europium activated yttrium-oxysulfide ($Y_2O_2S$:Eu) based phosphor or a terbium doped yttrium oxysulfide ($Y_2O_2S$:Tb) based phosphor.

25. The image intensifier of claim 23 wherein the thin-film phosphor layer comprises a thin-film phosphor layer having a thickness of from about 0.3 nanometers (nm) to about 1 nm.

26. The image intensifier of claim 25 wherein the conductive layer comprises a metallic layer having a thickness of from about 0.1 nanometers (nm) to about 500 nm.

27. The image intensifier of claim 25 wherein the conductive layer comprises a transparent non-metallic layer having a thickness of about 0.1 nanometers (nm) to about 500 nm.

28. The image intensifier of claim 23 wherein the substrate comprises an image re-inverter.

29. The image intensifier of claim 28 wherein the image re-inverter comprises a twisted fiber optic bundle.

30. The image intensifier of claim 23, further comprising:
a secondary electron emitter layer disposed proximate at least a portion of the conductive layer.

31. The image intensifier of claim 30 wherein the secondary electron emitter layer comprises a layer that includes one or more metal oxides.

32. The image intensifier of claim 31 wherein the one or more metal oxides included in the secondary electron emitter layer include at least one of: aluminum oxide ($Al_2O_3$) and magnesium oxide (MgO).

33. The image intensifier of claim 30 wherein the secondary electron emitter layer comprises a layer having a thickness of from about 0.1 nanometers (nm) to about 100 nm.

34. The image intensifier of any of claims 23 through 33, further comprising:
a first voltage source to maintain a first potential difference across the first vacuum space; and
a second voltage source to maintain a second potential difference across the second vacuum space.

35. The image intensifier of claim 34, further comprising:
an eyepiece disposed proximate the second end of the twisted fiber optic bundle.

36. A system for forming an image intensifier phosphor screen, the system comprising:
a substrate;
means for depositing a thin-film phosphor layer having a root-mean-square (RMS) surface roughness of from: about 0.3 nanometers (nm) to about 5 nm across at least a portion of the substrate; and
means for depositing a conductive layer having a thickness of less than 500 nanometers (nm) across at least a portion of the thin-film phosphor layer.

37. The system of claim 36, further comprising:
means for disposing a secondary electron emitter layer proximate at least a portion of the conductive layer.

* * * * *